(12) United States Patent
Lovett

(10) Patent No.: US 6,181,621 B1
(45) Date of Patent: Jan. 30, 2001

(54) THRESHOLD VOLTAGE MISMATCH COMPENSATED SENSE AMPLIFIER FOR SRAM MEMORY ARRAYS

(75) Inventor: Simon J. Lovett, Fremont, CA (US)

(73) Assignee: Cypress Semiconductor Corp., San Jose, CA (US)

( * ) Notice: Under 35 U.S.C. 154(b), the term of this patent shall be extended for 0 days.

(21) Appl. No.: 09/458,776

(22) Filed: Dec. 10, 1999

(51) Int. Cl.$^7$ .................................................. G11C 7/00
(52) U.S. Cl. .............................................................. 365/205
(58) Field of Search ................................... 365/154, 156, 365/190, 205, 207, 208, 233

(56) References Cited

U.S. PATENT DOCUMENTS

| | | | |
|---|---|---|---|
| 5,828,597 | * 10/1998 | Madan | 365/156 |
| 5,831,897 | * 12/1999 | Hodges | 365/156 |
| 5,949,706 | * 9/1999 | Chang et al. | 365/156 |
| 5,991,191 | * 11/1999 | Rao | 365/156 |
| 5,999,442 | * 12/1999 | Van Der Sanden et al. | 365/154 |
| 6,005,796 | * 12/1999 | Sywyk et al. | 365/156 |

OTHER PUBLICATIONS

Threshold Difference Compensated Sense Amplifier, by Shunichi Suzuki and Masaki Hirata, IEEE Journal of Solid–State Circuits, vol. SC–14, No. 6, Dec. 1979.

A High–Speed, Small–Area, Threshold–Voltage–Mismatch Compensation Sense Amplifier for Gigabit–Scale DRAM Arrays, by Takayuki Kawahara et al., IEEE Journal of Solid–State Circuits, vol. 23, No. 7, Jul. 1993.

* cited by examiner

Primary Examiner—Trong Phan
(74) Attorney, Agent, or Firm—Christopher P. Maiorana, P.C.

(57) ABSTRACT

A circuit comprising a first and a second sense transistor, a bitline and a complementary bitline, one or more first switches and one or more second switches. The first switches may be configured to couple the first sense transistor to the bitline and the second sense transistor to the complementary bitline. The second switches may be configured to couple the first sense transistor to the complementary bitline and the second sense transistor to the bitline. The first and second switches may be configured to provide voltage threshold matching between the first and second transistors.

20 Claims, 2 Drawing Sheets

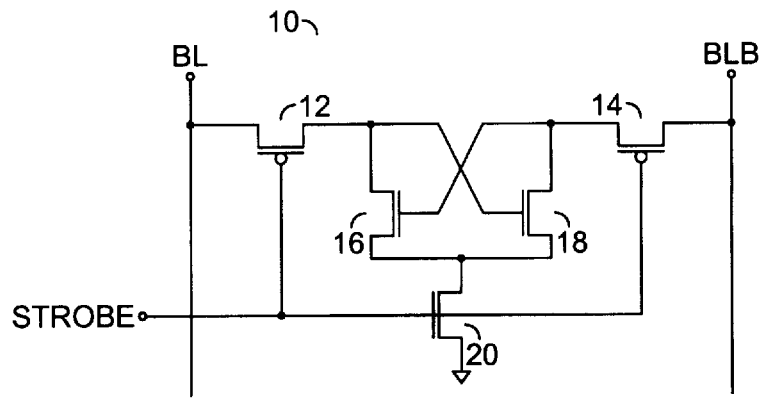
(CONVENTIONAL)
FIG. 1

THRESHOLD VOLTAGE MISMATCH COMPENSATED SENSE AMPLIFIER FOR SRAM MEMORY ARRAYS

FIELD OF THE INVENTION

The present invention relates to a method and/or architecture for threshold voltage mismatch compensation in the sense transistors of a sense amplifier generally and, more particularly, to threshold voltage mismatch compensation for a first sense stage of an SRAM sense amplifier.

BACKGROUND OF THE INVENTION

An example of a dynamic random access memory voltage mismatch compensated sense amplifier can be found in IEEE JSSC, Vol. 25, No. 7, July 1993 "A High Speed, Small-Area-Threshold Voltage Mismatch Compensation Sense Amplifier for Gigabit-Scale DRAM Arrays", which is hereby incorporated by reference in its entirety.

Such a conventional approach is suitable for Dynamic Random Access Memory (DRAM) arrays, but not as desirable for Static Random Access Memory (SRAM) arrays. Another example of a dynamic random access memory voltage mismatch compensated sense amplifier can be found in "Threshold Difference Compensated Sense Amplifier", Shunichi Suzuki and Masaki Hirata, JSSC, Vol. SC-14, No. 6, December 1979 is also incorporated by reference in its entirety.

FIG. 1 shows a conventional uncompensated static random access memory sense amplifier circuit 10. Such an approach has one or more of the following disadvantages: (i) no mismatch compensation; (ii) the bitline delta (i.e., differential) required for sensing is 5*94(ΔVt)=60 mV for many current SRAM designs; and/or (iii) 60 mV corresponds to a 0.5 ns to 1 ns longer access time for many SRAM designs. The following equation defines the sense voltage in the conventional circuit:

$$\Delta V = n * \frac{A_{VTD}}{\sqrt{WL}}$$

where n=5 for memories of devices 2MEG, 4MEG, 8MEG, n is the number of standard deviations (as defined in the field of statistics) which is required to achieve a certain manufacturing yield and is related to the number of placements of the circuit in question that exist on a given chip, typically 1,000–4,000. W and L are the channel length and width of the sense devices 16, 18 in FIG. 1. $A_{VTD}$ is a constant established by experiment/experience.

The circuit 10 generally comprises a transistor 12, a transistor 14, a transistor 16, a transistor 18 and a transistor 20. A bitline BL may be connected to the transistor 12. A bitline BLB may be connected to the transistor 14. The signal STROBE may be presented to a gate at the transistor 12, a gate at the transistor 14 and a gate at the transistor 20. The circuit 10 illustrates an example of a conventional SRAM sense amplifier approach and has the disadvantages mentioned.

SUMMARY OF THE INVENTION

The present invention concerns a circuit comprising a first and a second sense transistor, a bitline and a complementary bitline, one or more first switches and one or more second switches. In one example, the first switches may be n-channel or p-channel devices. The first switches may be configured to couple the first sense transistor to the bitline and the second sense transistor to the complementary bitline. The second switches may be configured to couple the first sense transistor to the complementary bitline and the second sense transistor to the bitline. The first and second switches may be configured to provide voltage threshold matching between the first and second transistors.

The objects, features and advantages of the present invention include providing an architecture and/or method for voltage mismatch compensation that may (i) allow for an absence of a 60 mV (or more or less) bitline delta (e.g., the voltage needed to overcome a mismatch), (ii) improve the operational speed of a sense amplifier, (iii) provide a sense amplifier suitable for synchronous devices, and/or (iv) may be used for asynchronous devices which use "ATD" (Address Transition Detection) circuitry.

BRIEF DESCRIPTION OF THE DRAWINGS

These and other objects, features and advantages of the present invention will be apparent from the following detailed description and the appended claims and drawings in which:

FIG. 1 is a circuit diagram of a conventional SRAM sense amplifier circuit without threshold voltage mismatch compensation;

DETAILED DESCRIPTION OF THE PREFERRED EMBODIMENTS

Figure 2:
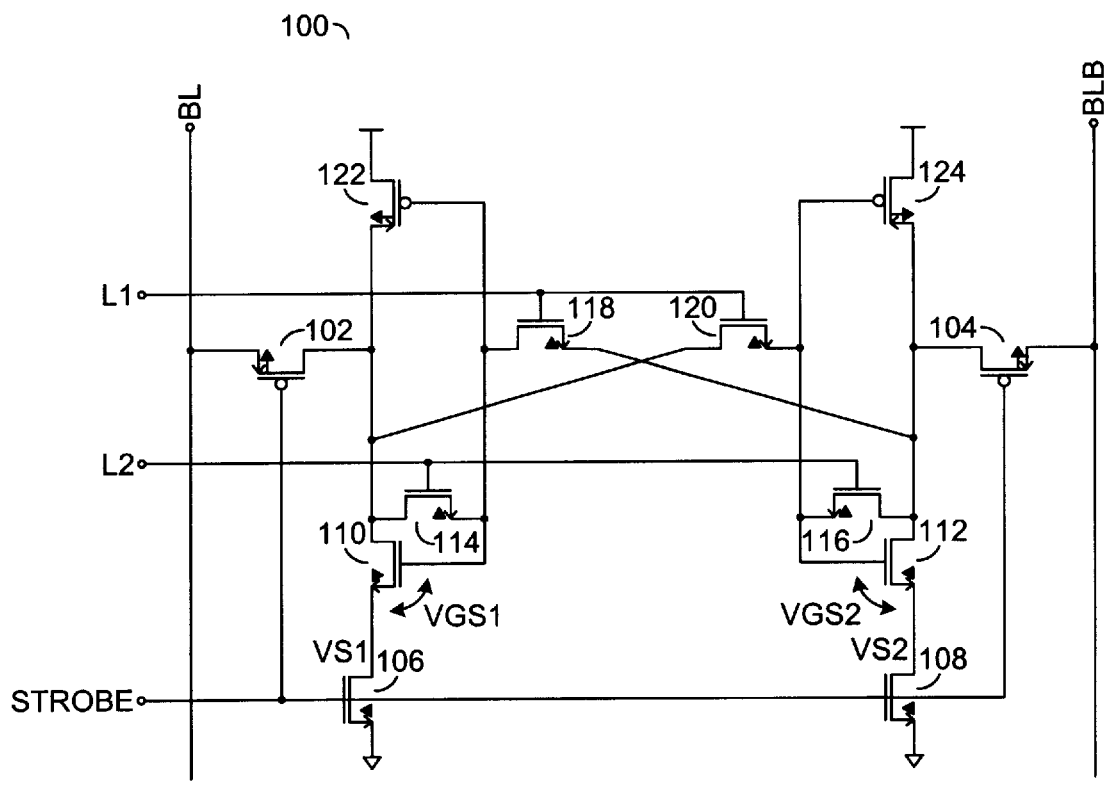
FIG. 2 is a circuit diagram of a preferred embodiment of the present invention.

Referring to FIG. 2, a diagram of a circuit 100 is shown in accordance with a preferred embodiment of the present invention. The circuit 100 generally comprises a transistor 102, a transistor 104, a transistor 106, a transistor 108, a transistor 110, a transistor 112, a transistor 114, a transistor 116, a transistor 118, a transistor 120, a transistor 122, and a transistor 124. In one example, the transistor 110 and the transistor 112 may be sense transistors. A bitline BL may be connected to the transistor 102. A bitline BLB may be connected to the transistor 104. The transistors, in one example, may be implemented as n-channel or p-channel devices. The bitline BLB may be a complementary bitline to the bitline BL. A control signal (e.g., L1) may be presented to a gate of the transistors 118 and the gate of the transistor 120. A control signal (e.g., L2) may be presented to the gate of the transistor 114 and the gate of the transistor 116. A control signal (e.g., STROBE) may be presented to the gate of the transistor 102, the gate of the transistor 104, the gate of the transistor 106 and the gate of the transistor 108.

During a voltage threshold adjust phase, the signal L2 is generally "on" (e.g., a digital HIGH, or 1) and the signal L1 and the signal STROBE are generally "off" (e.g., a digital LOW, or 0). However, the particular polarities of the on (e.g., asserted) and off (e.g., de-asserted) states of the control signals L1, L2 and STROBE may be adjusted (e.g., reversed) accordingly to meet the design criteria of a particular implementation. The voltages on the nodes Vs1 (e.g., the gate to source voltage Vgs of the transistor 110) and Vs2 (e.g., the gate to source voltage Vgs of the transistor 112) are set to the threshold voltages (e.g., Vtg1 and Vtg2) of the transistors 110 and 112, respectively. Due to small differences in fabrication, the threshold voltages Vt of the transistor 110 and the transistor 112 will normally be slightly different. With the signal L2 on and the signal L1 and the signal STROBE off, the transistors 110 and 112 are generally connected as diodes (e.g., saturated n-channel MOS transistors, in one example).

During an evaluation phase, the signal L2 is generally off and the signal L1 is generally on. In such a state, the transistors 110 and 112 may be configured as a cross coupled latch. The voltages on the bitlines BL and BLB may be passed on to the internal latch nodes. The circuit 100 may be fully zero adjusted to compensate for a threshold voltage Vt mismatch between the transistors 110 and 112. Fully zero adjusted generally means that the voltages "Vgs1" and "Vgs2" in FIG. 2 compensate for the intrinsically different threshold voltages of the devices 110 and 112. The voltage thresholds Vts of the transistor 110 and the transistor 112 are physical manufacturing limits and cannot be changed by circuit techniques. The circuit 100 generally sets the sources of 110 and 112 (e.g., "Vgs1" and "Vgs2" in FIG. 2) to slightly different voltages which will compensate for the different voltage thresholds of transistors 110 and 112. When the evaluation phase begins, the small bitline differential is amplified exponentially by the latch stage.

The circuit 100 may be enabled by the signal STROBE transitioning from low to high. The circuit 100 may reduce access time by up to 1 ns when implemented in synchronous/asynchronous (ATD) parts (e.g., 200 MHz–>250 MHz parts). The circuit 100 generally combines a cross-coupled sense amplifier with a source biased threshold Vt adjustment. The circuit 100 may be implemented, in one example, in an SRAM device. However, the circuit 100 may be implemented in other devices, such as DRAMS, SDRAMS, etc.

The circuit 100 may provide a threshold voltage Vt mismatch compensated latched sense amplifier scheme where the compensation Vt bias may be applied to each of the sources of the cross-coupled devices 110 and 112.

One advantage of the circuit 100 over the conventional approach described in FIG. 1 is that 60 mV of bitline delta is no longer required to overcome a threshold voltage mismatch. While the bitline delta has been described generally as 60 mV, other bitline delta ranges, such as 70 mV–90 mV, 60 mV–100 mV, 40 mV–120 mV, 30 mV–150 mV, etc., may be implemented accordingly to meet the design criteria of a particular implementation. In any event, the circuit 100 generally allows for a lower bitline delta than the conventional approach described in FIG. 1. A lower bitline delta may improve speed (e.g., MHz, $t_{cyc}$, $t_{co}$, etc.) and current consumption (e.g., $t_{ids}$) for synchronous parts by reducing the wordline "on" time (e.g., the signal "STROBE" may be applied earlier than in the case of uncompensated amplifier which may increase the access speed). The circuit 100 may provide faster sensing and may be suitable for SRAM sensing.

The transistors may be implemented, in one example, as NMOS/PMOS devices, CMOS devices, BJT devices or other appropriate devices necessary to meet the design criteria of a particular implementation. The devices 110 and 112 may be implemented, in one example, as n-channel devices. The devices 122 and 124 may be optional load devices for the cross-coupled devices 110 and 112 and may restore CMOS full-rail output levels, if needed to meet the design criteria of a particular implementation.

The circuit 100 may implement SRAM compatibility with latch style operation and p-channel devices to restore (MOS) levels in the latch. The circuit 100 may be useful to increase speed (e.g., MHz) for future fast SRAMs, especially as parts continue to shrink and threshold voltage Vt mismatch becomes worse. The circuit 100 may implement a threshold voltage Vt mismatch compensated latched sense amplifier scheme where the compensation for threshold voltage Vt bias is generally applied to the sources of the n-channel cross-coupled devices.

Figure 3:
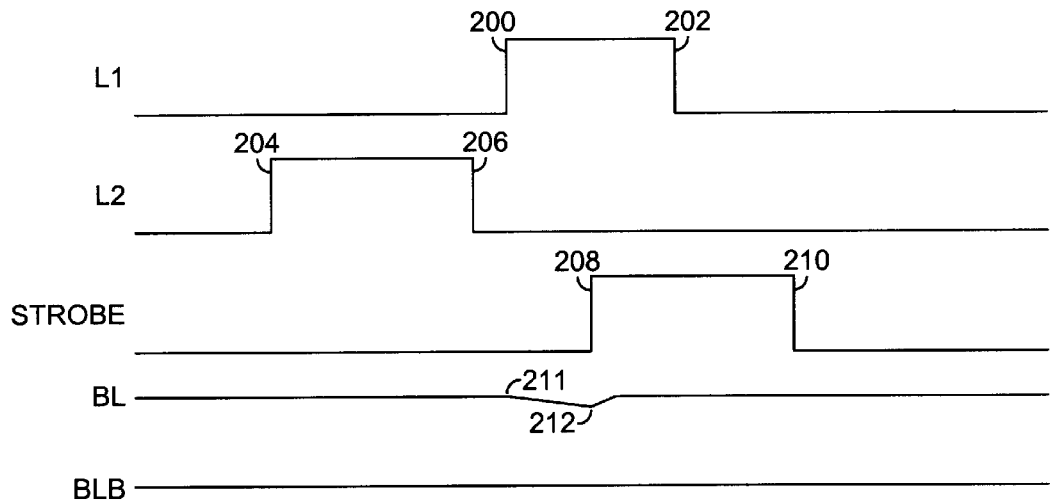
FIG. 3 is a timing diagram illustrating the operation of the circuit of FIG. 2.

Referring to FIG. 3, a timing diagram of the operation of the circuit 100 is shown. The signal L1 generally has a positive transition 200 and a negative transition 202. The signal L2 generally has a positive transition 204 and a negative transition 206. The signal STROBE generally has a positive transition 208 and a negative transition 210. The signal BL generally has a negative transition 211 as the small read current from the memory cell develops a small voltage different between the signals BL and BLB according to, in one example, the following expression:

$$V = \frac{i}{c} \int i dt$$

where i=icell, c=bitline capacitance, and dt=sense time. The signal BLB is shown without transitions. In general, the positive transition 212 of the signal BL generally responds to the positive transition of the signal STROBE. The negative transition 211 on the signal BL generally corresponds to the signal L1 and the memory cell wordline turning on. The signal L1, the signal L2 and the signal STROBE generally respond to a master clock (e.g., in the case of synchronous device) and respond to a derived clock pulse (e.g., ATD pulse) for asynchronous devices.

Figure 4:
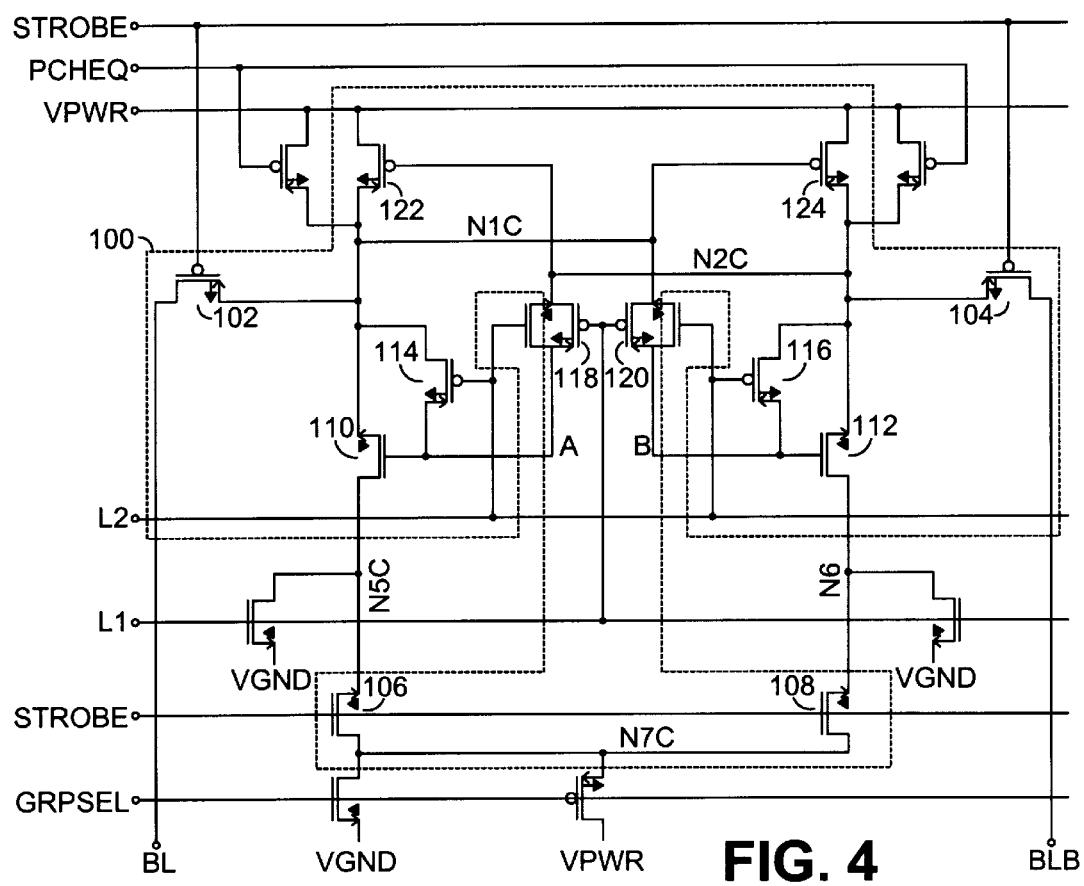
FIG. 4 is a diagram of the present invention implemented in the context of an SRAM.

Referring to FIG. 4, an example of the present invention implemented in the context of an SRAM is shown. The signal L1 and the signal L2 are generally timed from the master clock in a synchronous device. The relative timings of the signal L1 and the signal L2 are generally set by the designer. For an asynchronous part with ATD, the signal L1 and the signal L2 are generally derived from the ATD signal (e.g., the ATD signal responds to a transition detached on an address or control pin). Elements related to the SRAM circuit are shown external to the circuit 100.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
    a first and a second sense transistor;
    a first bitline and a second bitline complementary to said first bitline;
    a first bitline switch configured to couple said first sense transistor and said first bitline;
    a second bitline switch configured to couple said second sense transistor and said second bitline; and
    a plurality of first switches configured to couple said first sense transistor to said second sense transistor and said second sense transistor to said first sense transistor;
    wherein said first plurality of switches are configured to compensate for a first threshold voltage of said first sense transistor and a second threshold voltage of said second sense transistor.

2. The circuit according to claim 1, wherein said plurality of first switches are controlled by a first control signal.

3. The circuit according to claim 1, further comprising:
    a plurality of second switches configured to couple (i) a gate and a source of said first sense transistor and (ii)

a gate and a source of said second sense transistor, wherein said second plurality of switches are further configured to compensate for a first threshold voltage of said first sense transistor and a second threshold voltage of said second sense transistor.

4. The circuit according to claim 3, wherein said plurality of second switches are controlled by a second control signal.

5. The circuit according to claim 3, wherein said plurality of second switches configure said first and second sense transistors as diodes.

6. The circuit according to claim 1, further comprising:

a first and second load transistor coupled between said first and second sense transistors and ground.

7. The circuit according to claim 6, wherein said first and second load transistors are controlled by a strobe signal.

8. The circuit according to claim 1, wherein said circuit comprises a sense amplifier.

9. The circuit according to claim 1, wherein said circuit is implemented as a sense amplifier of a memory.

10. The circuit according to claim 1, wherein said circuit is implemented as a sense amplifier of a synchronous memory device.

11. The circuit according to claim 1, wherein said circuit is implemented as a sense amplifier of an asynchronous memory device.

12. The circuit according to claim 1, wherein said circuit comprises a first stage of a sense amplifier.

13. A method for providing a threshold voltage match between a plurality of sense transistors of a sense amplifier, comprising the steps of:

(A) charging a first and a second node to a first and a second threshold voltage;

(B) turning on a memory cell to begin discharging a bitline capacitance; and (C) developing a bitline differential to provide voltage threshold compensation of said plurality of sense transistors.

14. A circuit comprising:

a first and a second sense transistor;

a first bitine; and a second bitline complementary to said first bitline;

means for coupling said first sense transistor to said first bitline and said second sense transistor to said second bitline;

means for coupling said first sense transistor to said said second sense transistor and said second sense transistor to said first sense transistor; and means for compensation for a first threshold voltage of said first sense transistor and a second voltage threshold of said second sense transistor.

15. The circuit according to claim 14, wherein said circuit comprises a sense amplifier.

16. The circuit according to claim 14, wherein said circuit is implemented as a sense amplifier of a memory.

17. The circuit according to claim 14, wherein said circuit is implemented as a sense amplifier of a synchronous memory device.

18. The circuit according to claim 14, wherein said circuit is implemented as a sense amplifier of an asynchronous memory device.

19. The circuit according to claim 14, wherein said circuit comprises a first stage of a sense amplifier.

20. The circuit according to claim 14, further comprising:

means for coupling a gate of said first sense transistor to a source of said first sense transition and a gate of said second sense transistor to a source of said second sense transistors and configured to further compensate for a first threshold voltage of said first sense transistor and a second threshold voltage of said second sense transistor.

* * * * *